(12) United States Patent
Garcia Ordonez et al.

(10) Patent No.: US 12,549,193 B2
(45) Date of Patent: Feb. 10, 2026

(54) MODULO-BASED ANALOG-TO-DIGITAL CONVERSION APPARATUS AND METHOD

(71) Applicant: HUAWEI TECHNOLOGIES CO., LTD., Guangdong (CN)

(72) Inventors: Luis Garcia Ordonez, Boulogne Billancourt (FR); Maxime Guillaud, Boulogne Billancourt (FR); Ganghua Yang, Shanghai (CN); Paul Ferrand, Boulogne Billancourt (FR); Melissa Duarte Gelvez, Boulogne Billancourt (FR); Xu Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 143 days.

(21) Appl. No.: 18/506,447

(22) Filed: Nov. 10, 2023

(65) Prior Publication Data
US 2024/0162914 A1  May 16, 2024

Related U.S. Application Data

(63) Continuation of application No. PCT/CN2021/093101, filed on May 11, 2021.

(51) Int. Cl.
H03M 1/64 (2006.01)
(52) U.S. Cl.
CPC ..................... H03M 1/64 (2013.01)
(58) Field of Classification Search
CPC .................................................. H03M 1/64
See application file for complete search history.

(56) References Cited

U.S. PATENT DOCUMENTS

| | | | |
|---|---|---|---|
| 7,253,761 B1 * | 8/2007 | Hoyos | H04B 1/71632 341/143 |
| 10,623,014 B2 * | 4/2020 | Pagnanelli | H03M 1/662 |
| 11,218,158 B1 * | 1/2022 | Patil | H03M 1/1071 |

(Continued)

FOREIGN PATENT DOCUMENTS

| | | |
|---|---|---|
| WO | 2018014945 A1 | 1/2018 |
| WO | 2021197582 A1 | 10/2021 |
| WO | 2022122155 A1 | 6/2022 |

OTHER PUBLICATIONS

Or Oroentlich et al: "A Modulo-Based Architecture for Analog-to-Digital Conversion," arxiv.org. Cornell University Library. 201 Olin Library Cornell University Ithaca, NY 14853, Jun. 23, 2018 (Jun. 23, 2018), XP081140872; 17 total pages.

(Continued)

Primary Examiner — Mohamed Barakat
(74) Attorney, Agent, or Firm — Rimon PC

(57) ABSTRACT

A modulo-based ADC implementation is provided and involves converting an input analog signal into phases of other M periodic analog reference signals based on one or more transfer functions, wherein $M \geq 2$. The phase of each of the M reference signals comprises a folded signal corresponding to the input analog signal that is amplitude-folded to fall within a required amplitude range. This signal-to-phase conversion allows a modulo operation to be implemented over the input analog signal. Further, the M reference signals are used to obtain M discrete-time digital signals which, in turn, are used to obtain a digital representation of the input analog signal.

20 Claims, 11 Drawing Sheets

(56) References Cited

U.S. PATENT DOCUMENTS

| | | | | |
|---|---|---|---|---|
| 2013/0342377 | A1* | 12/2013 | Lin | H03M 1/12 |
| | | | | 341/143 |
| 2015/0180500 | A1* | 6/2015 | Kropfitsch | H03M 1/204 |
| | | | | 341/200 |
| 2018/0191369 | A1* | 7/2018 | Yamazaki | H04J 11/0056 |
| 2019/0103876 | A1 | 4/2019 | Bhandari et al. | |
| 2020/0275045 | A1* | 8/2020 | Higashi | H03M 1/64 |
| 2021/0143827 | A1* | 5/2021 | Huynh | H03M 1/0854 |

OTHER PUBLICATIONS

He Yan et al: "An ENOB-enhanced Optical Analog-to-digital Converter with Cascaded Step-size MMI and Modulo Operation," 2021 Conference on Lasers and Electro-Optics (CLEO), OSA, May 9, 2021 (May 9, 2021), pp. 1-2, XP034002867; 2 total pages.
Or Ordentlich et al, "Integer-Forcing Source Coding," arXiv:1308.6552v1 [cs.IT], Aug. 29, 2013; 15 total pages.
Luis G. Ordóñez et al, "Integer Forcing Analog-to-Digital Conversion for Massive MIMO Systems," in Proc. Asilomar Conference on Signals, Systems and Computers, Pacific Grove, 2016; 5 total pages.
Adithya Krishna et al, "Unlimited Dynamic Range Analog-to-Digital Conversion," arXiv:1911.09371v1 [eess.SP], Nov. 21, 2019; 11 total pages.
Walt Kester, "ADC Architectures VI: Folding ADCs," MT-025 Tutorial, Analog Devices, MT-025, Tutorial, Technical Report, vol. 27, 2009; 12 total pages.
Anatol Khilo et al, "Photonic ADC: overcoming the bottleneck ofelectronic jitter," Optics Express 20, 2012; pp. 4454-4469; 16 total pages.
Franz X. Kärtner et al, "Progress in Photonic Analog-to-Digital Conversion," in Optical Fiber Communication Conference/National Fiber Optic Engineers Conference 2013, OSA Technical Digest, 2013; 3 total pages.
Paul W. Juodawlkis et al, "Optically Sampled Analog-to-Digital Converters," IEEE Transactions on Microwave Theory and Techniques, vol. 49, No. 10, Oct. 2001; pp. 1840-1853 (14 total pages).
Ayush Bhandari et al, "On Unlimited Sampling", arXiv:1707.06340v2 [cs.IT] Nov. 8, 2017, total 11 pages.
Elad Romanov et al, "Above the Nyquist Rate, Modulo Folding Does Not Hurt," arXiv:1903.12289v1 [cs.IT], Mar. 28, 2019, 5 total pages.
Ayush Bhandari et al, "On Unlimited Sampling and Reconstruction", arXiv:1905.03901v2 [cs.IT] Nov. 30, 2020, total 24 pages.
J. C. Twichell et al, "Phase-Encoded Optical Sampling for Analog-to-Digital Converters", IEEE Photonics Technology Letters, vol. 12, No. 9, Sep. 2000, total 3 pages.
Zongjie Huang et al, "Any bias point control of Mach-Zehnder Electro-optic Modulator and its Applications in Optimization of Radio-over-Fiber links," 2011 International Topical Meeting on Microwave Photonics jointly held with the 2011 Asia-Pacific Microwave Photonics Conference, Dec. 1, 2011; pp. 218-221 (4 total pages).
Ayush Bhandari et al, "On identifiability in unlimited sampling", DOI: 10.1109/SampTA45681.2019.9030894, 2019, total 4 pages.
George C. Valley, "Photonic analog-to-digital converters", Mar. 5, 2007, vol. 15, No. 5, Optics Express 1956, total 28 pages.

* cited by examiner

MODULO-BASED ANALOG-TO-DIGITAL CONVERSION APPARATUS AND METHOD

CROSS-REFERENCE TO RELATED APPLICATIONS

This application is a continuation of International Application No. PCT/CN2021/093101, filed on May 11, 2021, the disclosure of which is hereby incorporated by reference in its entirety.

BACKGROUND

Applying digital signal processing algorithms to an input analog signal requires an interface between the input analog signal and a digital signal processor. As an example of such an interface, an ADC apparatus, also known as an AD converter, may be used, whose tasks are to sample and quantize a continuous-time continuous-amplitude (i.e. analog) signal in order to create discrete-time discrete-valued (i.e. digital) inputs required by any digital signal processing algorithm. If input analog signals are bandlimited and sampled at the Nyquist rate or above and quantized with very high precision, then the effects of the AD converters are negligible, since digital signals reconstructed at the digital signal processor from the discrete-time digital inputs approximate the input analog signals with negligible distortion.

In some applications, very high-precision AD converters are however not cost and/or power-efficient or not even feasible using the existing technology. For example, this is the case when the ADC is applied to wideband multi-GHz analog signals. Indeed, the existing ADC technology working at very high sampling rates and high resolution is limited by a timing (or aperture) jitter, i.e. the failure to sample at precisely defined times. More specifically, electronic-based AD converters cannot achieve timing jitters smaller than one femtosecond and, hence, photonic-based AD converters are preferred to meet the strict timing jitter required by sampling frequencies in the order of tens of GHz. Furthermore, wideband AD converters with very high resolution are challenging even theoretically. Indeed, their accuracy is strictly below 8 bits, and this is not enough in some applications. For example, it cannot guarantee high-order modulations required in envisioned THz wireless communications to support very high throughputs. Therefore, new ADC strategies are being investigated.

One such ADC strategy has been recently proposed in the literature under the name of modulo-based ADC or modulo-ADC. The modulo-based ADC allows avoiding clipping errors caused by the conventional ADC but requires additional digital signal processing to reconstruct a digital estimate of the original analog signal from modulo-reduced discrete-time digital inputs resulting from the modulo-based ADC. This is not always possible to do and requires some conditions placed on the input analog signals to hold. In case an ADC is applied to a single input analog signal, the input analog signal needs to present some time correlation, or it needs to be generated by means of oversampling.

In general, the prior art solutions relating to the modulo-based ADC involve using corresponding digital reconstruction algorithms for specific ADC problems. However, the prior art solutions have not specified the actual modulo-based ADC implementation. There is therefore a need to provide an ADC apparatus configured to implement a modulo-based ADC and a corresponding method.

SUMMARY

This summary is provided to introduce a selection of concepts in a simplified form that are further described below in the detailed description. This summary is not intended to identify key features of the present disclosure, nor is it intended to be used to limit the scope of the present disclosure.

It is an objective of the present disclosure to provide a technical solution that allows modulo-based ADC to be performed on analog signals.

One or more of the objectives above is achieved by the features of the independent claims in the appended claims. Further embodiments and examples are apparent from the dependent claims, the detailed description and the accompanying drawings.

According to a first aspect, an ADC apparatus is provided, which comprises a signal-to-phase conversion unit, an ADC unit, and a digital signal processing (DSP) unit. The signal-to-phase conversion unit is configured to convert an input analog signal into phases of M periodic reference signals based on at least one transfer function, wherein M≥2. The phase of each of the M periodic reference signals comprises a folded signal. The folded signal corresponds to the input analog signal that is amplitude-folded to fall within an amplitude range. Given this, the signal-to-phase conversion corresponds to the outcome of a modulo operation. The ADC unit is configured to obtain M discrete-time digital signals by performing an ADC operation on the M periodic reference signals within the amplitude range. The DSP unit is configured to obtain, based on the M discrete-time digital signals, a digital representation of the input analog signal. By so doing, it is possible to perform the modulo-based ADC on the input analog signal. Furthermore, such a configuration of the ADC apparatus may provide the high-resolution quantization of the input analog signal at a very high sampling rate and very high signal bandwidths. Given this, the accuracy of obtaining the digital representation of the input analog signal may be increased.

In one embodiment of the first aspect, the phases of at least two of the M periodic reference signals have a difference other than 0 or π. By using at least one pair of periodic reference signals with such a phase difference, it is possible to cope with the problem of phase sign ambiguity which occurs, for example, when the pair of periodic reference signals are represented by two sine functions such that $\sin(x(t))=\sin(\pi-x(t))$, where $x(t)$ is the input analog signal.

In one embodiment of the first aspect, the input analog signal changes in a predefined dynamic range, and each of the at least one transfer functions is a bijective function in the predefined dynamic range of the input analog signal. By using the bijective function, it is possible to provide a proper relationship between the phases of the reference signals and the input analog signal, thereby increasing the accuracy of obtaining the digital representation of the input analog signal.

In one embodiment of the first aspect, the at least one transfer function comprises a first transfer function and a second transfer function, and, in the predefined dynamic range of the input analog signal, the first transfer function and the second transfer function are a same bijective function. In this embodiment, the first transfer function has a first constant phase shift and the second transfer function has a second constant shift. The first constant phase shift of the first transfer function and the second constant phase shift of the second transfer function have a difference other than 0 or π. By using such phase shifts for the same bijective function, it is possible to cope with the above-mentioned problem of phase sign ambiguity arising, for example, from sin(x(t))=sin(π−x(t)).

In one embodiment of the first aspect, each of the at least one transfer function is an affine function. By using the affine functions, it is possible to provide a proper relationship between the phases of the reference signals and the input analog signal, thereby increasing the accuracy of obtaining the digital representation of the input analog signal. Furthermore, the possibility of choosing among the affine functions and the bijective functions makes the ADC apparatus according to the first aspect more flexible in use.

In one embodiment of the first aspect, the ADC unit comprises M synchronized ADC subunits each configured to perform the ADC operation on one of the M periodic reference signals. By so doing, it is possible to perform the ADC operation on the M periodic reference signals in parallel, thereby increasing the accuracy of obtaining the digital representation of the input analog signal.

In one embodiment of the first aspect, at least one of the M ADC subunits has a different bit resolution or different quantization level (i.e., different quantization function) compared to the other synchronized ADC subunits of the M synchronized ADC subunits. This may allow one to differently quantize the M periodic reference signals, if required and depending on particular applications, thereby making the ADC apparatus according to the first aspect more flexible in use.

In one embodiment of the first aspect, the DSP unit is configured to obtain the digital representation of the input analog signal by:
  determining a phase of at least one of the M discrete-time digital signals;
  inverting one of the at least one transfer function based on the determined phase, while using at least one other of the M discrete-time digital signals to solve phase sign ambiguity; and
  obtaining the digital representation of the input analog signal based on the inverted transfer function.

By so doing, it is possible to obtain the digital representation of the input analog signal by using only two discrete-time digital signals or, in other words, only two periodic reference signals.

In one embodiment of the first aspect, the signal-to-phase conversion unit comprises an optical source and M phase-biased electro-optic modulators. The optical source is configured to generate a pulse train that serves as the M periodic reference signals. Each of the M phase-biased electro-optic modulators has an electro-optical response as one of the at least one transfer function and is configured to receive the input analog signal and modulate the pulse train with the input analog signal, thereby converting the input analog signal into the phases of the M periodic reference signals. By so doing, it is possible to implement the modulo-based ADC with photonic sampling.

In one embodiment of the first aspect, the optical source comprises a mode-locked laser. The mode-locked laser may generate an ultra-stable pulse train that may be used to optically sample the input analog signal, while addressing the problem of a timing jitter.

In one embodiment of the first aspect, each of the M phase-biased electro-optic modulators comprises a Mach-Zehnder modulator (MZM). This type of electro-optic modulator is preferred due to its low optical relative loss, high optical power processing capability, and wide optical bandwidth.

In one embodiment of the first aspect, at least two of the M MZMs have a modulation index that is more than 1. If the transfer function is represented by a sine/cosine function, the MZMs with such a modulation index may fully use the sine/cosine transfer function and not only its linear part (as would be the case for the MZMs with the modulation index less than 1).

In one embodiment of the first aspect, the at least two MZMs have a same bijective transfer function supplemented by different constant phase shifts which are obtained by applying different DC bias voltages to the at least two MZMs. By using different DC bias voltages in this embodiment, it is possible to ensure that the phase difference between the corresponding periodic reference signals is other than 0 or π.

In one embodiment of the first aspect, the DSP unit is configured to obtain the digital representation of the input analog signal by applying a machine-learning algorithm. The machine-learning algorithm may speed-up the operation of obtaining the digital representation of the input analog signal.

According to a second aspect, an ADC method is provided. The ADC method starts with the step of converting an input analog signal into phases of M periodic reference signals based on at least one transfer function, wherein M≥2. The phase of each of the M periodic reference signals comprises a folded signal. The folded signal corresponds to the input analog signal that is amplitude-folded to fall within an amplitude range. Given this, the signal-to-phase conversion corresponds to the outcome of the modulo operation. The method further proceeds to the step of obtaining M discrete-time digital signals by performing an ADC operation on the M periodic reference signals within the amplitude range. After that, the method goes on to the step of using the M discrete-time digital signals to obtain a digital representation of the input analog signal. By so doing, it is possible to perform the modulo-based ADC on the input analog signal. Furthermore, the method according to the second aspect may provide the high-resolution quantization of the input analog signal at a very high sampling rate and very high signal bandwidths. Given this, the accuracy of obtaining the digital representation of the input analog signal may be increased.

In one embodiment of the second aspect, the phase of at least two of the M periodic reference signals have a difference other than 0 or π. By using at least one pair of periodic reference signals with such a phase difference, it is possible to cope with the problem of phase sign ambiguity which occurs, for example, when the pair of periodic reference signals are represented by two sine functions such that sin(x(t))=sin(π−x(t)), where x(t) is the input analog signal.

In one embodiment of the second aspect, the input analog signal changes in a predefined dynamic range, and each of the at least one transfer functions is a bijective function in the predefined dynamic range of the input analog signal. By using the bijective function, it is possible to provide a proper relationship between the phases of the reference signals and the input analog signal, thereby increasing the accuracy of obtaining the digital representation of the input analog signal.

In one embodiment of the second aspect, the at least one transfer function comprises a first transfer function and a second transfer function, and, in the predefined dynamic range of the input analog signal, the first transfer function and the second transfer function are a same bijective function. In this embodiment, the first transfer function has a first constant phase shift and the second transfer function has a second constant phase shift. The first constant phase shift of the first transfer function and the second constant phase shift of the second transfer function have a difference other than 0 or $\pi$. By using such phase shifts for the same bijective function, it is possible to cope with the above-mentioned problem of phase sign ambiguity arising, for example, from $\sin(x(t))=\sin(\pi-x(t))$.

In one embodiment of the second aspect, each of the at least one transfer functions is an affine function. By using the affine functions, it is possible to provide a proper relationship between the phases of the reference signals and the input analog signal, thereby increasing the accuracy of obtaining the digital representation of the input analog signal. Furthermore, the possibility of choosing among the affine functions and the bijective functions makes the method according to the second aspect more flexible in use.

In one embodiment of the second aspect, the digital representation of the input analog signal is obtained by:
  determining a phase of at least one of the M discrete-time digital signals;
  inverting one of the at least one transfer function from the determined phase, while using at least one other of the M discrete-time digital signals to solve phase sign ambiguity; and
  obtaining the digital representation of the input analog signal based on the inverted transfer function.

By so doing, it is possible to obtain the digital representation of the input analog signal by using only two discrete-time digital signals or, in other words, only two periodic reference signals.

In one embodiment of the second aspect, the digital representation of the input analog signal is obtained by applying a machine-learning algorithm. The machine-learning algorithm may allow one to reduce the time required to obtain the digital representation of the input analog signal.

According to a third aspect, a computer program product is provided. The computer program product comprises a computer-readable storage medium storing a computer code which, when executed by at least one processor, causes the at least one processor to perform the method according to the second aspect. By using such a computer program product, it is possible to simplify the implementation of the method according to the second aspect in any ADC apparatus, like the ADC apparatus according to the first aspect.

According to a fourth aspect, a signal processing apparatus is provided. The signal processing apparatus comprises a receiving unit and the ADC apparatus according to the first aspect. The receiving unit is configured to receive the input analog signal and provide the input analog signal to the ADC apparatus according to the first aspect for its processing in the above-described manner. By using such an ADC apparatus in the signal processing apparatus according to the fourth aspect, it is possible to perform the modulo-based ADC on the input analog signal at a very high sampling rate and very high signal bandwidths. This, in turn, makes it possible to use the signal processing apparatus according to the fourth aspect, for example, in THz wireless communications.

Other features and advantages of the present disclosure will be apparent upon reading the following detailed description and reviewing the accompanying drawings.

BRIEF DESCRIPTION OF THE DRAWINGS

The present disclosure is explained below with reference to the accompanying drawings, in which.

DETAILED DESCRIPTION

Figure 1:
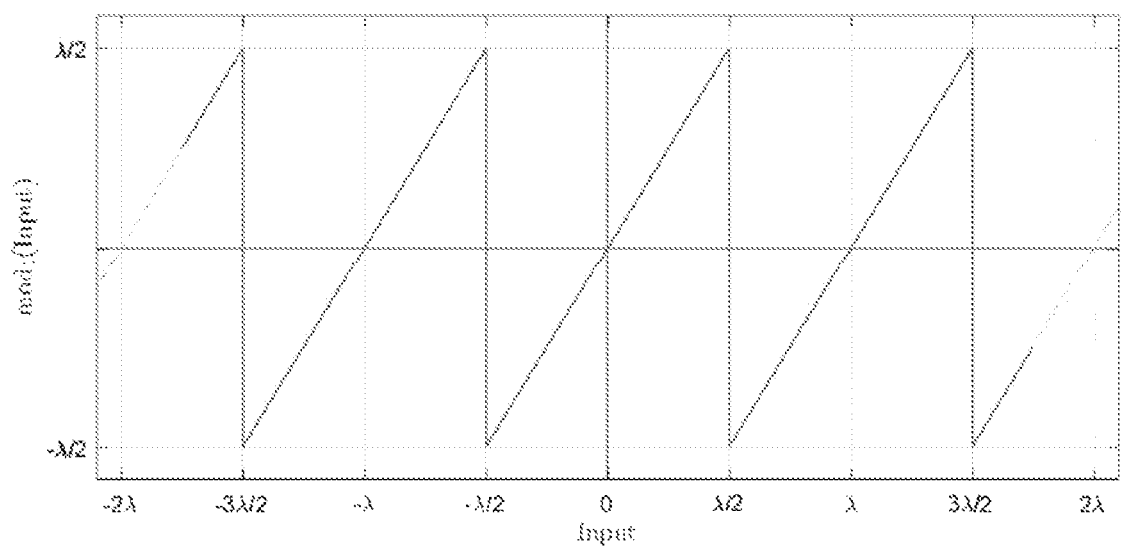
FIG. 1 shows one example of a transfer function of a modulo-$\lambda$ operation.

Various embodiments of the present disclosure are further described in more detail with reference to the accompanying drawings. However, the present disclosure may be embodied in many other forms and should not be construed as limited to any certain structure or function discussed in the following description. In contrast, these embodiments are provided to make the description of the present disclosure detailed and complete.

According to the detailed description, it will be apparent to the ones skilled in the art that the scope of the present disclosure encompasses any embodiment thereof, which is disclosed herein, irrespective of whether this embodiment is implemented independently or in concert with any other embodiment of the present disclosure. For example, the apparatuses and method disclosed herein may be implemented in practice by using any number of the embodiments provided herein. Furthermore, it should be understood that any embodiment of the present disclosure may be implemented using one or more of the features presented in the appended claims.

The word "exemplary" is used herein in the meaning of "used as an illustration". Unless otherwise stated, any embodiment described herein as "exemplary" should not be construed as preferable or having an advantage over other embodiments.

Although the numeric terminology, such as "first", "second", etc., may be used herein to describe various embodiments, it should be understood that these embodiments should not be limited by this numeric terminology. This numeric terminology is used herein only to distinguish one embodiment from another embodiment. Thus, a first embodiment discussed below could be called a second embodiment, without departing from the teachings of the invention.

As used in the embodiments disclosed herein, an ADC apparatus or, in other words, AD converter may refer to a device configured to convert an analog signal into its digital representation by means of a modulo-based ADC. The basic idea behind the modulo-based ADC is to apply a modulo operation to the analog signal before its quantization such that a resulting folded signal perfectly matches a quantizer input range. It should be noted that the analog signal may be represented by any one of an RF signal received by a receiver, an acoustic signal picked up by a microphone, a light signal entering a digital camera, etc. Generally speaking, the analog signal to be digitally processed in the embodiments disclosed herein may be any wireless or wired signal. Furthermore, the ADC apparatus may be integrated into any signal processing apparatus which may be implemented, for example, as a part of a communication apparatus (e.g., a user equipment (UE) or network node), a radar, a sensing apparatus (e.g., a measurement bridge or voltmeter), etc.

The UE may refer to a mobile device, a mobile station, a terminal, a subscriber unit, a mobile phone, a cellular phone, a smart phone, a cordless phone, a personal digital assistant (PDA), a wireless communication device, a desktop computer, a laptop computer, a tablet computer, a gaming device, a netbook, a smartbook, an ultrabook, a medical device or medical equipment, a biometric sensor, a wearable device (for example, a smart watch, smart glasses, a smart wrist band, etc.), an entertainment device (for example, an audio player, a video player, etc.), a vehicular component or sensor, a smart meter/sensor, an unmanned vehicle (e.g., an industrial robot, a quadcopter, etc.), industrial manufacturing equipment, a global positioning system (GPS) device, an Internet-of-Things (IoT) device, an Industrial IoT (IIoT) device, a machine-type communication (MTC) device, a group of Massive IoT (MIoT) or Massive MTC (mMTC) devices/sensors, or any other suitable device configured to support wireless communications. In some embodiments, the UE may refer to at least two collocated and interconnected UEs thus defined.

The network node may relate to a fixed point of communication for the UE in a particular wireless communication network. The network node may be implemented as a Radio Access Network (RAN) node referred to as a base transceiver station (BTS) in terms of the 2G communication technology, a NodeB in terms of the 3G communication technology, an evolved NodeB (eNodeB) in terms of the 4G communication technology, and a gNB in terms of the 5G New Radio (NR) communication technology. The RAN node may serve different cells, such as a macrocell, a microcell, a picocell, a femtocell, and/or other types of cells. The macrocell may cover a relatively large geographic area (for example, at least several kilometers in radius). The microcell may cover a geographic area less than two kilometers in radius, for example. The picocell may cover a relatively small geographic area, such, for example, offices, shopping malls, train stations, stock exchanges, etc. The femtocell may cover an even smaller geographic area (for example, a home). Correspondingly, the RAN node serving the macrocell may be referred to as a macro node, the RAN node serving the microcell may be referred to as a micro node, and so on.

Turning back to the modulo-based ADC, how the modulo-based ADC may be implemented from an ideal point of view will now be described. The present disclosure provides a modulo-based ADC implementation which behaves as close as possible to the ideal modulo-based ADC, as will be explained further.

An ideal response of a modulo-based ADC apparatus with a sample frequency $f_s=1/T_s$, an input range $[-\lambda/2, \lambda/2]$, and a resolution of b bits may be described as follows. Let x(t) be an input analog signal (bandlimited with a bandwidth $BW \leq f_s/2$), then the ideal modulo-based ADC may be mathematically expressed as:

$$y[\ell]=Q_b(\text{mod}_\lambda(x(\ell T_s))),$$

where

The sampling process, i.e., the conversion from continuous-time to discrete-time, is assumed ideal (i.e. there are no sampling jitter errors) and is abstracted as changing the continuous-time t to the sample index $\ell=1, 2, 3, \ldots$ . Accordingly, $x[\ell]=x(\ell T_s)$ denotes the discrete-time version of the input analog signal x(t), where $T_s$ is the sampling period.

$\text{mod}_\lambda(\cdot)$ is the modulo-$\lambda$ operation that folds the input analog signal whenever its amplitude is higher than $\lambda/2$ or lower than $-\lambda/2$. Mathematically, it is defined as the following transfer function:

$$\text{mod}_\lambda(x)=x-\lambda(\lfloor x/\lambda - 1/2 \rfloor),$$

where $\lfloor \cdot \rfloor$ denotes the floor function. FIG. 1 shows the above-written transfer function of the modulo-$\lambda$ operation (the notation "input" in FIG. 1 denotes the input analog signal x(t)). That is, FIG. 1 shows the transfer function of the modulo operation with a predefined constant equal to $\lambda$.

$Q_b(\cdot)$ is the quantization function that is an abstraction modelling the composition of quantization mapping (which outputs b bits) and digital reconstruction (which maps quantization bits to appropriate signal levels). Given quantization thresholds $$\gamma_0 = -\frac{\lambda}{2}, \gamma_1, \gamma_2, \ldots, \gamma_{2^b-1}, \gamma_{2^b} = \frac{\lambda}{2},$$

and reconstruction levels $\mu_0, \mu_1, \mu_2, \ldots, \mu_{2^b-1}$, the quantization function $Q_b(\cdot)$ may be expressed as follows:

$$Q_b(x) = \sum_{i=0}^{2^b-1} \mu_i \mathcal{J}(\gamma_i \leq x \leq \gamma_{i+1}),$$

where $\mathcal{J}(\cdot)$ denotes the indicator function.

The above-given mathematical expression of the ideal modulo-based ADC, i.e. y[$\ell$], does not impose any particular order between performing the sampling and modulo operations. In fact, these operations may be even simultaneously performed. The quantization function $Q_b(\cdot)$ remains general and, hence, includes, for example, non-uniform quantizers.

As an example, for a uniform quantizer with the resolution of b bits, the input range $[-\lambda/2, \lambda/2]$, and a quantization step-size $\mu=2^{-b}\lambda$, the quantization function $Q_b(\cdot)$ is given by $$Q_b(x) = \begin{cases} -\mu(2^b - 1)/2 & x \leq -\lambda/2 \\ \mu(\lfloor x/\mu \rfloor + 1/2) & -\lambda/2 < x < \lambda/2 \\ \mu(2^b - 1)/2 & x \geq \lambda/2 \end{cases}.$$

Figure 2:
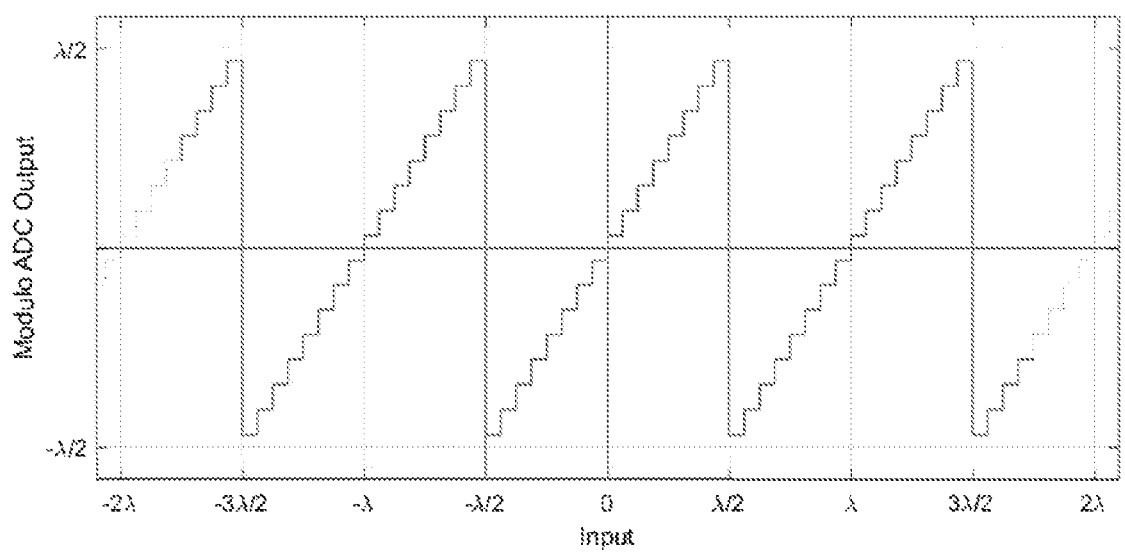
FIG. 2 shows the transfer function for the case of an ideal modulo-based ADC at a quantization resolution of b=4 bits.

FIG. 2 shows the transfer function for the case of the ideal modulo-based ADC at the resolution of b=4 bits.

Any practical implementation of the modulo-based ADC cannot support an infinite number of folds, as implied by the above-given definition of the modulo operation, i.e. $\text{mod}_\lambda(x)$. Otherwise, this would require supporting an infinite dynamic range of the input analog signal x(t), which is physically impossible. In fact, there is even no need to support the infinite number of folds, and, in practice, it is enough to guarantee the maximum number of folds $\lfloor \max\|x(t)\|/\lambda \rfloor$ for the optimum $\lambda$, i.e. the minimum possible $\lambda$ guaranteeing the recovery of the input analog signal from discrete-time folded samples outputted by the modulo-based ADC apparatus. Consequently, the number of folds to be supported depends on the application: typically less than 10 in general-purpose AD converters or several order of magnitudes higher in the context of a full duplex transceiver.

It should be also noted that there are no commercially available devices implementing the modulo-based ADC concept as such, and only "ad-hoc" solutions or proof-of-concept designs have been proposed in the past.

For example, one approach consists in using commercially available folding AD converters or self-reset AD converters. These AD converters follow the so-called bit-per-stage architecture. There are as many stages as a bit resolution b, each of which has a "bit" output and a "residue" output. The residue output of one stage is an input to the next stage and the last bit is detected with a single comparator. It turns out that the b bits outputted by a folding AD converter may be interpreted as follows: the m most significant bits are used to count the number of folds and the remaining b−m least significant bits give a quantization index of a residual signal after folding. Hence, by using the folding AD converter with the resolution of b bits, one may implement the modulo-based ADC with the resolution of b−m bits, which allows the analog signal being folded $2^{m-1}$ times by discarding the m most significant bits outputted by the folding AD converter. An alternative design for the self-reset AD converters includes special circuits configured to compute the modulo operation and count the number of folds followed by a quantization module of a successive approximation AD converter. The main problem with the folding AD converters or self-reset AD converters is that they are not cost or power-efficient, since, for example, the hardware used to count the number of folds is not necessary under the paradigm of the modulo-based ADC. Even more importantly, the number of times that the analog signal may be folded is small and intrinsically limited by the design of such AD converters. This prevents them from being used, for example, in full-duplex applications.

A different approach for implementing the modulo-based ADC implies that the modulo operation relies on a circular chain of inverter circuits, where the output of each inverter in the chain is connected to the input of the next inverter in the chain. The inversion for all inverters is then controlled by the same input signal. Such a circuit is called a ring oscillator. When wired this way, the frequency of oscillation in the ring oscillator will be a function of the input signal and it will generate a frequency modulated signal. Such a circuit has been long used for generating such frequency modulated signals, for example, for frequency modulated radio diffusion, but it may be repurposed as a modulo operator. The response of ring oscillators used as the modulo operation tends to have an uneven resolution, and the AD converters based on it also appear to perform relatively worse for high bitrates.

Besides the architectural limitations of the previous approaches, they also inherit the intrinsic limitation of electronic ADC technologies when converting high-speed RF signals, namely the so-called timing jitter (also referred to as aperture ambiguity or aperture jitter) and comparator ambiguity. The timing jitter is a random variation in the position of a temporal sampling interval. The result is that the sampling interval is not constant, but varies randomly, leading to accuracy degradation. The comparator ambiguity, a major limiting factor at high signal frequencies, comes from a finite speed with which an ADC comparator responds to small variations in an input analog signal to produce a correct quantization decision relative to a comparator reference.

The exemplary embodiments disclosed herein provide a technical solution that allows mitigating or even eliminating the above-mentioned drawbacks of the prior art. In particular, the technical solution disclosed herein relies on the fact that a phase of an input analog signal is naturally measured modulo $2\pi$. Given this, it is possible to convert the input analog signal into phases of other M periodic analog signals (hereinafter referred to as reference signals), where M≥2. The phase of each of the M periodic reference signals comprises a folded signal corresponding to the input analog signal that is amplitude-folded to fall within a required amplitude range. Thus, this signal-to-phase conversion allows the modulo operation to be implemented over the input analog signal. Further, the M periodic reference signals are used to obtain M discrete-time digital signals which, in turn, are used to obtain a digital representation of the input analog signal. By so doing, it is possible to perform the modulo-based ADC on the input analog signal.

Figure 3:
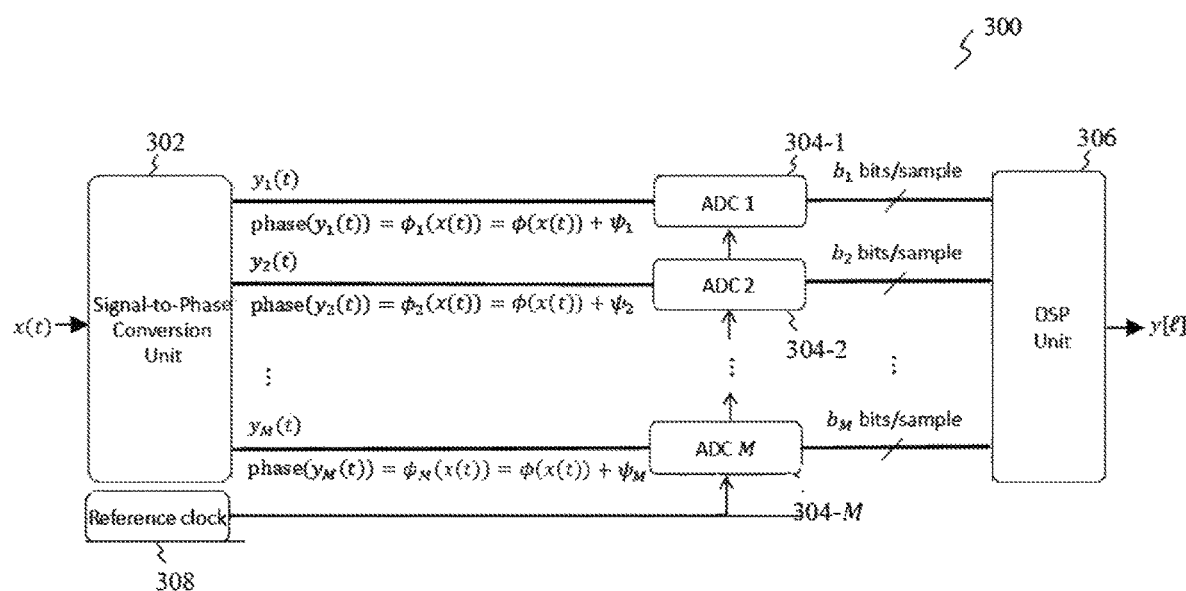
FIG. 3 shows a block diagram of an ADC apparatus in accordance with a first exemplary embodiment.

FIG. 3 shows a block diagram of an ADC apparatus 300 in accordance with a first exemplary embodiment. The ADC apparatus 300 comprises the following constructive elements: a signal-to-phase conversion unit 302, ADC subunits 304-1, 304-2, . . . , 304-M, and a digital signal processing (DSP) unit 306. The ADC apparatus 300 may optionally comprise a reference clock 308 configured to synchronize the operation of the ADC subunits 304-1, 304-2, . . . , 304-M. However, the ADC subunits 304-1, 304-2, . . . , 304-M may also operate asynchronously, for example, successively, if required and depending on particular applications. Furthermore, at least one of the ADC subunits 304-1, 304-2, . . . , 304-M may be configured to provide a different bit resolution b or different quantization level compared to the rest of the ADC subunits 304-1, 304-2, . . . , 304-M, if required and depending on particular applications. It should be noted that the number, arrangement and interconnection of the constructive elements constituting the ADC apparatus 300, which are shown in FIG. 3, are not intended to be any limitation of the present disclosure, but merely used to provide a general idea of how the constructive elements may be implemented within the ADC apparatus 300. For example, the subunits 304-1, 304-2, . . . , 304-M may be combined into a single ADC unit. If the subunits 304-1, 304-2, . . . , 304-M are implemented as individual devices included in the ADC apparatus 300, their number should be equal to the number of periodic reference signals to be used in the modulo-based ADC, as will be discussed further in detail.

Each of the ADC subunits 304-1, 304-2, . . . , 304-M may be implemented as integrated circuits (ICs). These ICs may be implemented based on any suitable semiconductor technology, such, for example, as Complementary Metal-Oxide-Semiconductor (CMOS), Bipolar CMOS technology, etc. As a certain example, these ICs may take the form of mixed-signal IC chips that integrate both analog and digital circuits.

The DSP unit 306 may be implemented as a CPU, general-purpose processor, single-purpose processor, microcontroller, microprocessor, application specific integrated circuit (ASIC), field programmable gate array (FPGA), digital signal processor, complex programmable logic device, etc. In some embodiments, the DSP unit 306 may be implemented as any combination of the aforesaid, e.g., as two or more microprocessors.

As for the signal-to-phase unit 302, it may be implemented by using electro-optic modulators or ring oscillators. In a preferred embodiment, the signal-to-phase unit 302 comprises the combination of an optical source (e.g., a mode-locked laser) and Mach-Zehnder modulators (MZMs).

Figure 4:
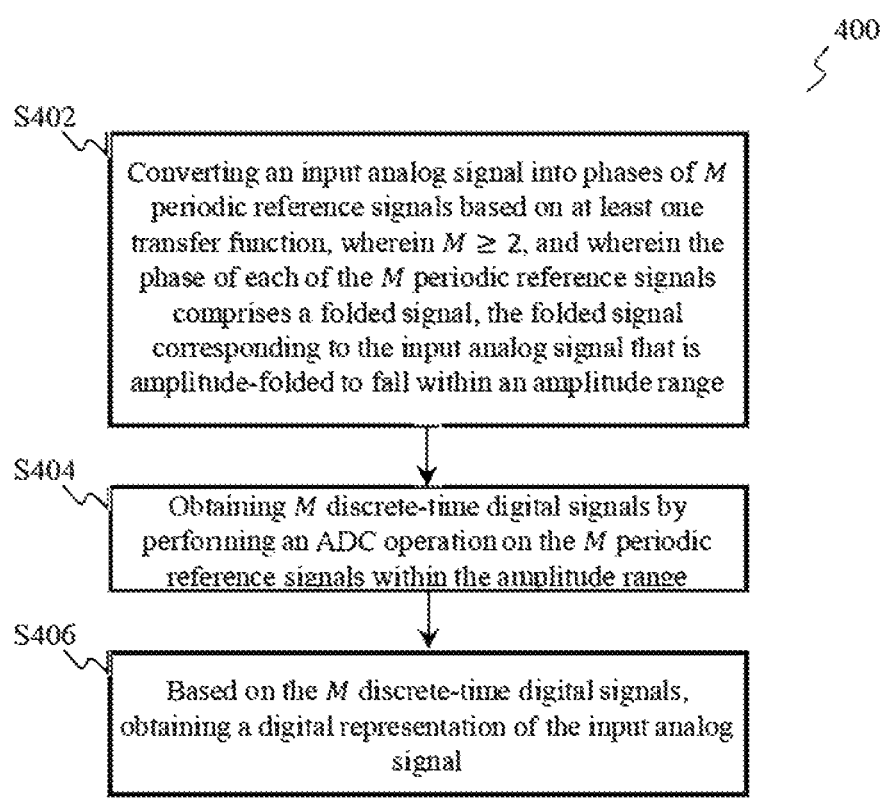
FIG. 4 shows a flowchart of an ADC method in accordance with one exemplary embodiment.

FIG. 4 shows a flowchart of an ADC method 400 in accordance with one exemplary embodiment. More specifically, the method 400 describes the operation of the ADC apparatus 300 in terms of the modulo-based ADC implementation. As shown in FIG. 4, the method 400 starts with a step S402, in which the signal-to-phase conversion unit 302 converts an input analog signal x(t) into phases of M periodic reference signals $y_1(t)$, $y_2(t)$, ... $y_M(t)$ based on transfer functions $\phi_1(x(t))$, ... $\phi_M(x(t))$, wherein M≥2. The phase of each of the M periodic reference signals $y_1(t)$, $y_2(t)$, y ... $y_M(t)$ comprises a folded signal (not shown) corresponding to the input analog signal x(t) that is amplitude-folded to fall within an amplitude range. The term "amplitude-folded" or, in other words, "folded by amplitude" implies the same folding as used earlier when describing the modulo-λ operation $mod_\lambda(x)$. Given this, the amplitude range may be equal to [−λ/2, λ/2], and the folded signal should be defined within this amplitude range. In general, the amplitude range should be selected such that the folded signal matches a quantization range of each of the ADC subunits 304-1, 304-2, ..., 304-M. The transfer functions $\phi_1(x(t))$, ... $\phi_M(x(t))$, may be bijective or affine. In the former case, the transfer function $\phi_i(x(t))$ may be bijective in a predefined dynamic range of the input analog signal x(t), where the term "dynamic range" refers to the ratio of the highest signal level to the lowest signal level. By so doing, the outcome of the step S402 is equivalent, to some extent, to the outcome of the modulo operation $mod_\lambda(x)$. Then, the method 400 proceeds to a step S404, in which each of the M periodic reference signals $y_1(t)$, $y_2(t)$, $y_M(t)$ is fed to a corresponding one of the ADC subunits 304-1, 304-2, ..., 304-M in order to be converted into a discrete-time digital signal within the same amplitude range. As a result of the step S404, there are M discrete-time digital signals. After that, the method 400 goes on to a step S406, in which the DSP unit 306 uses the M discrete-time digital signals to obtain a digital representation y[ℓ] of the input analog signal x(t). By using the method 400, it is possible to implement the modulo-based ADC as similar as possible to the above-described ideal modulo-based ADC.

As can be seen from FIG. 3, the phase of each of the M periodic reference signals $y_1(t)$, $y_2(t)$, ... $y_M(t)$ results from the transfer functions $\phi_1(x(t))$, ... (x(t)), which comprise the same bijective function $\phi(x(t))$ supplemented by different constant phase shifts $\psi_1, \psi_2, \ldots \psi_M$. To avoid the problem of phase sign ambiguity occurring, for example, when the M periodic reference signals $y_1(t)$, $y_2(t)$, ... $y_M(t)$ are represented by sine functions with some of them being such that $\sin(x)=\sin(\pi-x)$, at least two of the constant phase shifts $\psi_1$, $\psi_2, \ldots, \psi_M$ may have a difference other than 0 or π.

However, the phase structures shown in FIG. 3 should not be construed as any limitation of the present disclosure. In some other embodiments, the phase of each of the M periodic reference signals $y_1(t)$, $y_2(t)$, ... $y_M(t)$ may comprise a different function. In this case, there may be no need to use constant phase shifts. At the same time, the problem of phase sign ambiguity may be again addressed if the phases (but not the phase shifts) of at least two of the M periodic reference signals $y_1(t)$, $y_2(t)$, ... $y_M(t)$ have a difference other than 0 or In one embodiment, the DSP unit 306 may perform the step S406 of the method 400 as follows. At first, the DSP unit 306 determines a phase of at least one of the M discrete-time digital signals obtained by the ADC subunits 304-1, 304-2, ..., 304-M in the step S404 of the method 400. Then, the DSP unit 306 inverts one of the transfer functions $\phi_1(x(t))$, ... $\phi_M(x(t))$ based on the determined phase, while using at least one other of the M discrete-time digital signals to solve the problem of phase sign ambiguity. After that, the DSP unit 306 obtains the digital representation y[ℓ] of the input analog signal x(t) based on the inverted transfer function. By so doing, it is possible to use only two periodic reference signals when performing the modulo-based ADC on the input analog signal x(t).

In another embodiment, the DSP unit 306 may use, in the step 406 of the method 400, a suitable machine learning algorithm to properly process the M discrete-time digital signals outputted by the ADC subunits 304-1, 304-2, ..., 304-M. This may improve the accuracy of the step S406 of the method 400.

The following is one non-restrictive example of how to implement the modulo operation by using the step S402 of the method 400. First, assume that the input analog signal x(t) is converted in the step S402 of the method 400 into the phase of a periodic reference signal y(t), for example, as follows:

$$y(t)=A\sin(\phi)(x(t))+\psi),$$

where A is the amplitude, ψ is the initial constant phase shift, and $\phi(\cdot)$ denotes the phase transfer function, which is assumed to be any bijective function such that its inverse function $\phi^{-1}(\cdot)$ exists and satisfies $$\phi(x(t)+k\cdot\lambda)=\phi(x(t))+k\cdot 2\pi, k=\pm 1,\pm 2,\ldots.$$

This operation effectively folds the analog input signal x(t), since it holds $$y(t)=A\sin(\phi(x(t))+\psi)=A\sin(\phi(mod_\lambda(x(t)))+\psi).$$

However, the function relating y(t) with $\phi(x(t))$ is not linear and not even invertible in one 2π period, i.e. when $\phi(x(t))\in[-\pi, \pi)$, due to the phase ambiguity arising from $\sin(x)=\sin(\pi-x)$. In order to have enough information to recover $mod_\lambda(x(t))$ from y(t), the analog input signal x(t) is converted into the phases of at least two periodic reference signals. Consider the general case of the signal-to-phase converter 302 with the following M outputs:

$$y_i(t)=A_i\sin(\phi(x(t))+\psi_i), i=1,2,\ldots,M.$$

Then, the only requirement for uniquely obtaining $mod_\lambda(x(t))$ from y(t) is that there exists at least one pair of periodic reference signals $y_i(t)$ and $y_j(t)$ whose corresponding phase shifts $\psi_i$ and $\psi_j$ are neither equal nor separated by π modulo 2π:

$$|\psi_i-mod_{2\pi}(\psi_j)|\neq 0 \text{ and } |\psi_i-mod_{2\pi}(\psi_j)|\neq\pi.$$

In this case, the following is computed:

$$\phi_{A,i}=mod_{2\pi}(\arcsin(y_i(t)/A_i)-\psi_i), i=1,2,\ldots,M$$

$$\phi_{B,j}=mod_{2\pi}(\pi-\arcsin(y_j(t)/A_j)-\psi_j), j=1,2,\ldots,M$$

A further step comprises uniquely recovering $\phi(x(t)) \in [-\pi, \pi)$ as $$\phi(x(t))=\phi_{A,i} \text{ if } \phi_{A,1}=\phi_{A,2}=\ldots=\phi_{A,M}, \quad \text{(i)}$$

$$\begin{aligned}&\phi(x(t))=\phi_{B,i} \text{ if } \phi_{B,1}=\phi_{A,2}=\ldots=\phi_{B,M}, \text{ or } \phi(x(t))=\phi_{A,i},\\&\text{if for any } j \text{ such that } \phi_{A,i}\neq\phi_{A,j}, \text{ it holds that}\\&\phi_{A,i}=\phi_{B,j}.\end{aligned} \quad \text{(ii)}$$

Finally, it is possible to invert the phase transfer function and obtain the modulo operation as follows:

$$\text{mod}_\lambda(x(t))=\phi^{-1}(\phi(x(t)))$$

Given the above-given example, the whole modulo-based ADC implemented by using the method 400 may be described as follows:

(1) The analog input signal x(t) is converted, in the step S402 of the method 400, into the phase of M periodic reference signals {y_i(t)} such that there exists at least one pair of periodic reference signals $y_i(t)$ and $y_j(t)$ whose corresponding phase shifts $\psi_i$ and $\psi_j$ have a difference other than 0 or $\pi$.

(2) The M periodic reference signals outputted by the signal-to-phase conversion unit 302 are converted, in the step S404 of the method 400, into the M discrete-time digital signals by using the ADC units 304-1, 304-2, . . . , 304-M with possibly different bit resolutions and synchronized under the same reference clock 308:

$$\hat{y}_i[\ell]=Q_{b_i}(y_i(\ell \cdot T_s)), i=1,2,\ldots,M.$$

(3) The DSP unit 306 jointly processes, in the step S406 of the method 400, the M discrete-time digital signals $\{\hat{y}_i[\ell]\}$ to uniquely determine $\phi(x(t)) \in [-\pi, \pi)$ and linearize the transfer functions of the signal-to-phase conversion unit 302 to obtain the digital representation y[$\ell$] which approximates the output of the above-described ideal modulo-ADC.

According to the present disclosure, $\phi(x(t)) \in [-\pi, \pi)$ it) is recovered in the digital domain, after the M periodic reference signals outputted by the signal-to-phase conversion unit 302 have been converted to the M discrete-time digital signals using the ADC units 304-1, 304-2, . . . , 304-M.

Figure 5:
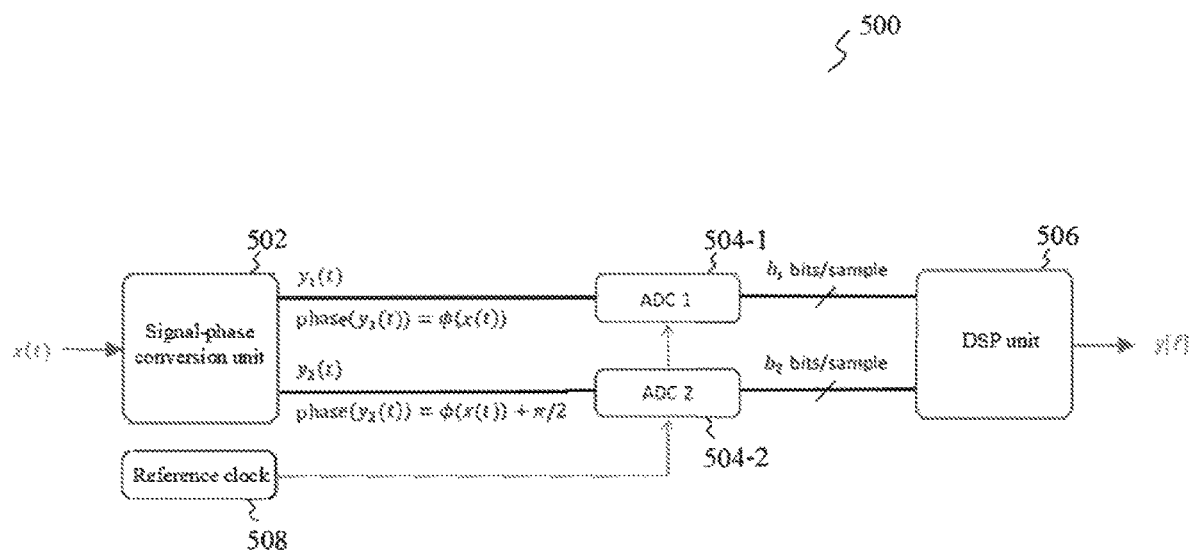
FIG. 5 shows a block diagram of an ADC apparatus in accordance with a second exemplary embodiment.

FIG. 5 shows a block diagram of an ADC apparatus 500 in accordance with a second exemplary embodiment. The ADC apparatus 500 comprises the following constructive elements: a signal-to-phase conversion unit 502, two ADC subunits 504-1, 504-2, and a DSP unit 506. Similar to the ADC apparatus 300, the ADC apparatus 500 may optionally comprise a reference clock 508 configured to synchronize the operation of the ADC subunits 504-1, 504-2. The constructive elements of the ADC apparatus 500 are intended to perform functions similar to those performed by the constructive elements of the ADC apparatus 300 in accordance with the method 400. The ADC apparatus 500 differs from the ADC apparatus 300 in that the modulo-based ADC is implemented therein by using the signal-to-phase conversion unit 502 with the following affine transfer functions:

$$\phi_1(x(t)) = \phi(x(t)) = \frac{2\pi}{\lambda}x(t)$$

$$\phi_2(x(t)) = \phi(x(t)) = \frac{\pi}{2} = \frac{2\pi}{\lambda}x(t) + \frac{\pi}{2}.$$

and with only two outputs providing a phase difference of $\pi/2$, namely:

$$y_1(t) = A\sin(\phi(x(t))) = A\sin\left(\frac{2\pi}{\lambda}x(t)\right),$$

$$y_2(t) = A\sin\left(\phi(x(t)) + \frac{\pi}{2}\right) = A\cos\left(\frac{2\pi}{\lambda}x(t)\right).$$

Then, upon performing, by the ADC subunits 504-1, 504-2, the ADC with quantization functions $Q_{b_1}(\cdot)$ and $Q_{b_2}(\cdot)$ having bit resolutions $b_1$ and $b_2$, respectively, the following discrete-time digital signals may be obtained:

$$\hat{y}_1[\ell] = Q_{b_1}\left(A\sin\left(\frac{2\pi}{\lambda}x(\ell T_s)\right)\right),$$

$$\hat{y}_2[\ell] = Q_{b_2}\left(A\cos\left(\frac{2\pi}{\lambda}x(\ell T_s)\right)\right).$$

At this point, there are different options to solve the problem of phase sign ambiguity and invert the transfer function of the phase-to-signal conversion unit 502, which basically depend on the quantization function applied by both the ADC subunits 504-1, 504-2.

For example, let us assume that the ADC subunit 504-1 is a high-resolution ADC subunit, while the ADC subunit 504-2 is a 1-bit ADC subunit. In case of converting $y_1(t)$ using the high-resolution ADC subunit 504-1, one may assume that $$\hat{y}_1[\ell] = A\sin\left(\frac{2\pi}{\lambda}x(\ell T_s)\right).$$

Then, converting $y_2(t)$ using the 1-bit ADC subunit 504-2 is as follows:

$$\hat{y}_2[\ell] = \text{sign}\left(A\cos\left(\frac{2\pi}{\lambda}x(\ell T_s)\right)\right).$$

Given this, the modulo-based ADC output, i.e. the output of the DSP unit 506, may be simply written as follows:

$$y[\ell] = \begin{cases} \frac{\lambda}{\pi}\arcsin\left(\frac{\hat{y}_1[\ell]}{A}\right), & \hat{y}_2[\ell] > 0 \\ -\frac{\lambda}{\pi}\arcsin\left(\frac{\hat{y}_1[\ell]}{A}\right), & \hat{y}_2[\ell] \leq 0 \end{cases} \approx Q_{b_1}(\text{mod}_\lambda(x(\ell T_s))),$$

One problem associated with the above-given exemplary implementation is that equivalent quantization errors become higher as the phase shift $\phi(x(t))$ approaches $\pi/2$, since $\sin(\phi(x(\ell T_s)))$ is far from linear. This problem may be alleviated by carefully designing the quantization thresholds and reconstruction levels associated with the high-resolution ADC subunit 504-1.

Figure 6A:
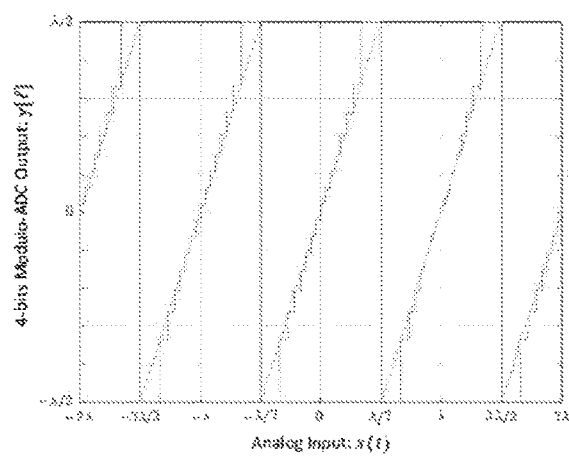
FIGS. 6A and 6B show digital representations of an input analog signal which are obtained using two different bit resolutions (i.e. 4 bits and 8 bits) of a high-resolution ADC subunit included in the ADC apparatus shown in FIG. 5.
Figure 6B:
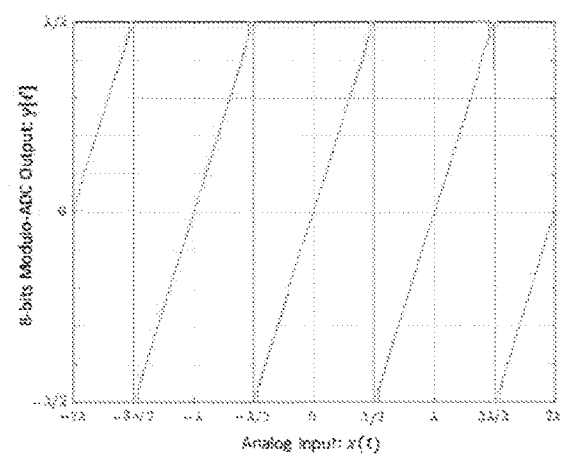

More specifically, FIGS. 6A and 6B show digital representations y[$\ell$] of the input analog signal x(t) which are obtained using two different bit resolutions (i.e. 4 bits and 8 bits) of the high-resolution ADC subunit 504-1. As can be seen, the quantization errors present in the digital representation y[$\ell$] corresponding to the 8-bit ADC subunit 504-1 are significantly lower than those present in the digital representation y[$\ell$] corresponding to the 4-bit ADC subunit 504-1. Still, when the phase shift $\phi(x(t))$ approaches $\pi/2$, i.e. when the input signal $x(\ell T_s)$ approaches $\lambda/2+k$, for $k=\pm 1$, $\pm 2, \ldots$, the quantization errors are relatively high.

A different option, which also alleviates the above-mentioned problem of the quantization errors (becoming higher as the phase shift $\phi(x(t))$ approaches $\pi/2$) comes from using two identical ADC subunits 504-1, 504-2 with the same quantization function $Q_b(\cdot)$ for converting both the outputs of the signal-to-phase conversion unit 502, i.e. the periodic reference signals $y_1(t)$ and $y_2(t)$. In this case, the digital representation may be obtained as follows:

$$y[\ell] = \frac{\lambda}{\pi} \text{atan}\left(\frac{\hat{y}_1[\ell]}{\hat{y}_2[\ell]}\right) \approx Q_b(\text{mod}_\lambda(x(\ell T_s))).$$

Figure 7A:
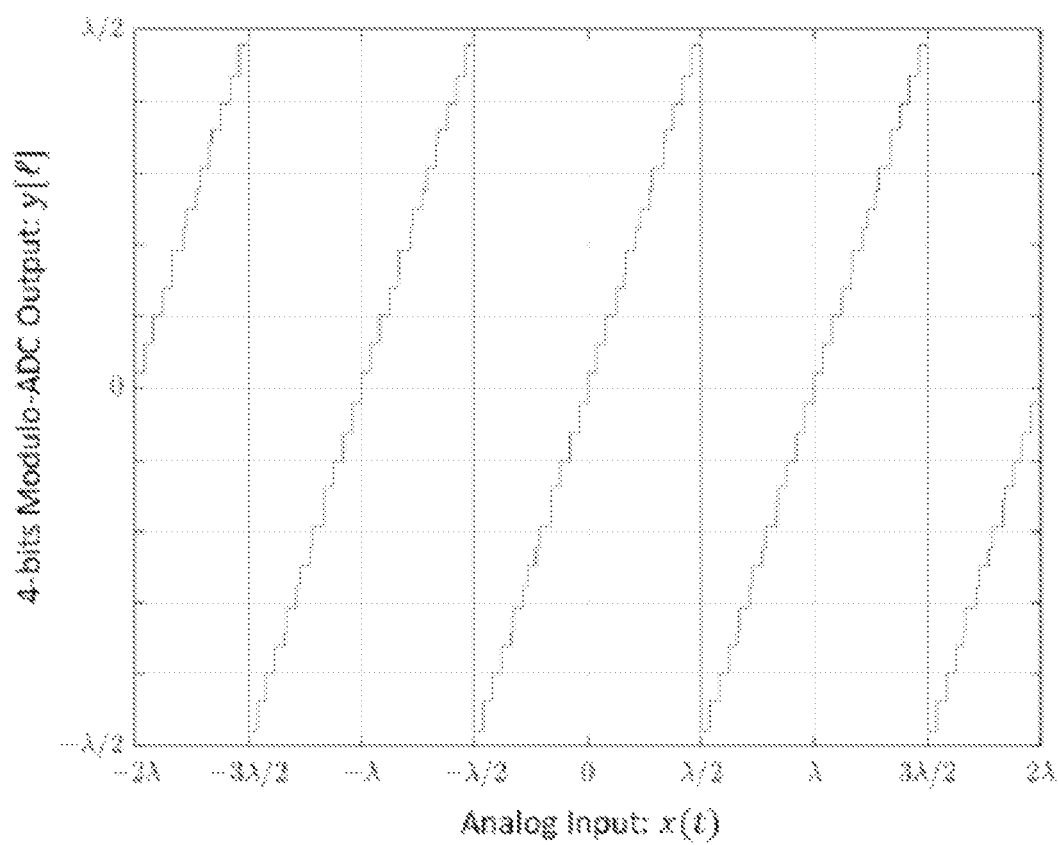
FIGS. 7A and 7B show digital representations y[$\ell$] of the input analog signal which are obtained using two different bit resolutions (i.e. 4 bits and 8 bits) of two identical ADC subunits included in the ADC apparatus shown in FIG. 5.
Figure 7B:
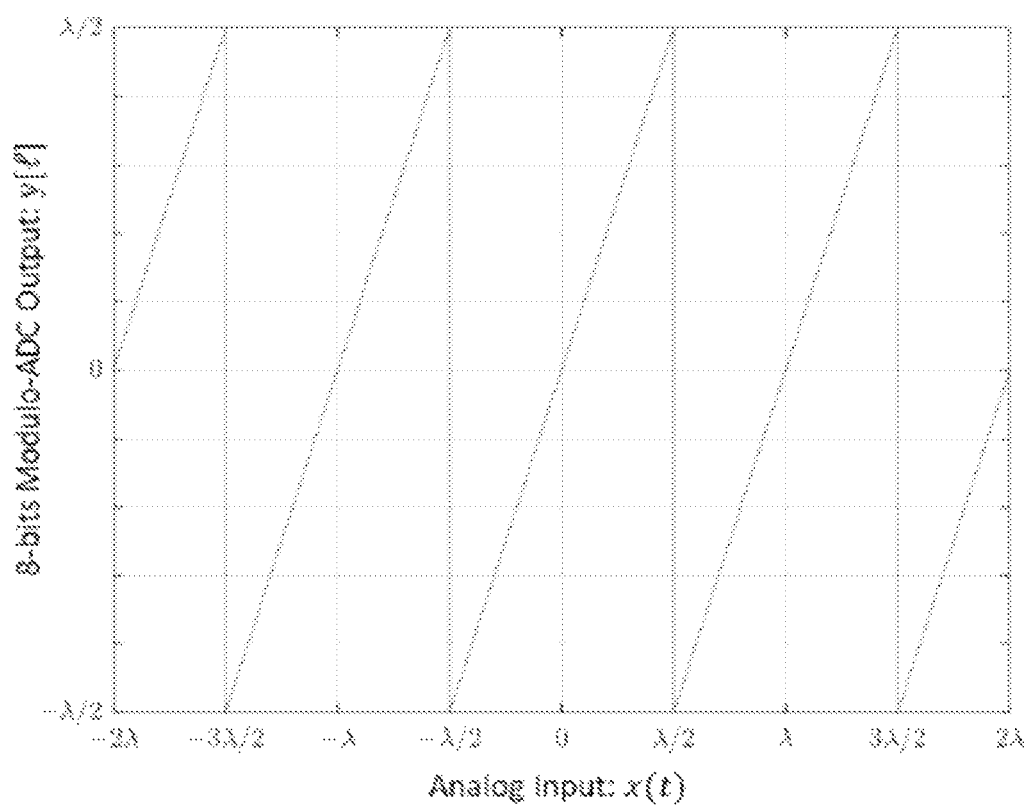

FIGS. 7A and 7B show digital representations y[$\ell$] of the input analog signal x(t) which are obtained using two different bit resolutions (i.e. 4 bits and 8 bits) of the two identical ADC subunits 504-1, 504-2. It can be seen that the quantization errors present in the digital representation y[$\ell$] corresponding to the 4-bit ADC subunits 504-1, 504-2 are significantly higher than those present in the digital representation y[$\ell$] corresponding to the 8-bit ADC subunits 504-1, 504-2. Specifically, the quantization errors present in the digital representation y[$\ell$] corresponding to the 8-bit ADC subunits 504-1, 504-2 can be hardly seen, so that the problem of the quantization errors becoming higher when $\phi(x(t))$ approaches $\pi/2$, which is shown in FIGS. 6A and 6B, has been alleviated.

Thus, the DSP unit 506 (as well as the DSP unit 306) may select different DSP algorithms depending on the transfer function used in the signal-to-phase conversion unit and the quantization functions used in the ADC subunits to convert the periodic reference signals to the digital signals.

Figure 8:
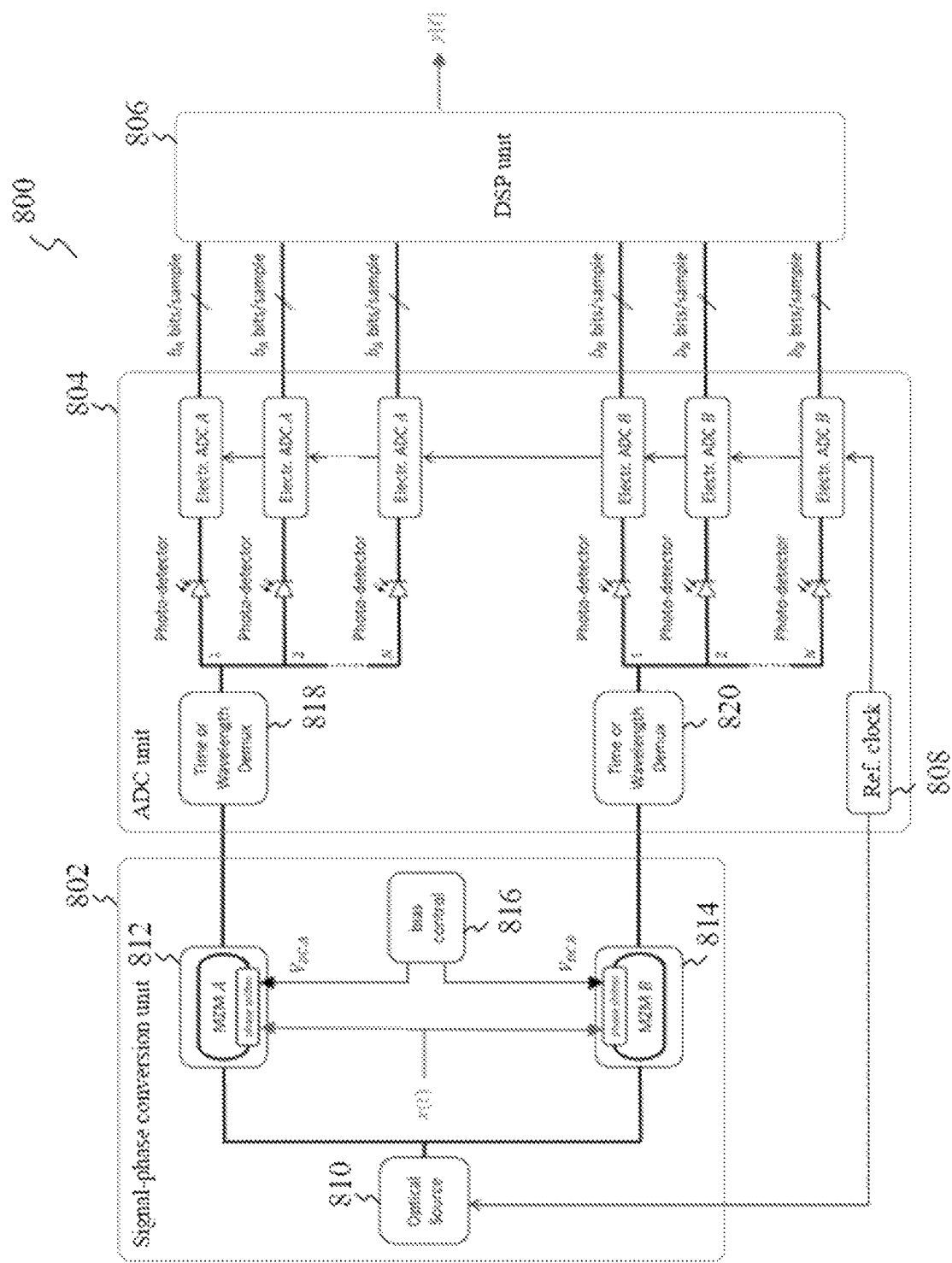
FIG. 8 shows a block diagram of an ADC apparatus in accordance with a third exemplary embodiment.

FIG. 8 shows a block diagram of an ADC apparatus 800 in accordance with a third exemplary embodiment. The ADC apparatus 800 comprises the following constructive elements: a signal-to-phase conversion unit 802, a single ADC unit 804, and a DSP unit 806. The ADC unit 804 is shown to encompass two groups of ADC subunits. Similar to the ADC apparatuses 300 and 500, the ADC apparatus 800 may optionally comprise a reference clock 808 configured to synchronize the operation of the two groups of ADC subunits. The constructive elements of the ADC apparatus 800 are intended to perform functions similar to those performed by the constructive elements of the ADC apparatuses 300 and 500 in accordance with the method 400.

More specifically, the signal-to-phase conversion unit 802 is configured as the combination of an optical source 810, two identical MZMs (A and B) 812, 814, and a bias control unit 816. The optical source 810 may be implemented as a mode-locked laser configured to generate an ultra-stable pulse train serving as the M periodic reference signals. The ultra-stable pulse train avoids the problem of the timing jitter. The MZMs 812, 814 driven by the optical source 810 are configured to receive the input analog signal x(t) and modulate the pulse train with the input analog signal x(t) such that the input analog signal x(t) is related to the phases of the M periodic reference signals via the transfer function, as discussed earlier. The MZMs 812, 814 may be further configured to receive corresponding DC bias voltages $V_{DC,A}$ and $V_{DC,B}$ from the bias control unit 816. The DC bias voltages $V_{DC,A}$ and $V_{DC,B}$ are controlled such that the difference between the associated phases $\phi_{DC}(V_{DC,A})$ and $\phi_{DC}(V_{DC,B})$ is equal to a desired value, such as $\pi/2$. It should be noted that the present disclosure is not limited to the application of the MZMs, and any other suitable electro-optic modulators may be used in the signal-to-phase conversion unit 802 for the same purpose. At the same time, it is preferable to use the MZMs due to their low optical relative loss, high optical power processing capability, and wide optical bandwidth. It is also worth noting that the number, arrangement and interconnection of the constructive elements constituting the ADC apparatus 800, which are shown in FIG. 8, are not intended to be any limitation of the present disclosure, but merely used to provide a general idea of how the constructive elements may be implemented within the ADC apparatus 800. For example, the number of the MZMs may be more than two, if required and depending on particular applications.

As mentioned above, the ADC unit 804 comprises the two groups of ADC subunits schematically denoted in FIG. 8 as "Electronic ADC A" and "Electronic ADC B", respectively, for the sake of convenience and in order not to overload the figure with reference numerals. The two groups of ADC subunits are also provided, respectively, with time or wavelength demultiplexers 818, 820 and two groups of photo-detectors. The pulses of the modulated pulse train are detected with the photo-detectors to generate current pulses which are then amplified and converted into digital samples (or, in other words, discrete-time digital signals) using the two groups of ADC subunits. As for the demultiplexers 818 and 820, they are used to alleviate bandwidth requirements of the photo-detectors and electronic ADC subunits. In particular, when multiple wavelengths are used, each pulse of the pulse train generated by the optical source 810 is separated into N sub-pulses, each at a different center wavelength, using a filter bank (not shown). These sub-pulses are then delayed by different amounts and re-combined into a single pulse train to form the optical source output, which now has its repetition rate increased by a factor of N. After the MZMs 812 and 814, different wavelengths are taken apart by the filter bank, and each wavelength is processed independently with its dedicated photo-detector and electronic ADC subunit. The resulting digital samples are finally combined at the DSP unit 806.

In one preferred embodiment, each of the MZMs 812, 814 has a modulation index $m_{RF} \gg 1$. This is in contradiction with the conventional application of MZMs for ADC, which requires the modulation index $m_{RF} \ll 1$. To explain such a selection of the modulation index for the MZMs 812, 814, the electro-optical response of a conventional MZM with a single output working in push-pull mode is described mathematically. Let $P_0$ be the light power at the MZM input, x(t) be the input RF analog signal, and $V_{DC}$ be the DC bias voltage, then the photocurrent at the MZM output may be accurately modeled as follows:

$$I(x(t)) = \frac{P_0}{2}\alpha(1 - \beta \cos(\phi_{RF}(x(t)) + \phi_{DC}(V_{DC}) + \phi)),$$

where $\alpha$ is the optical loss in the MZM, $\beta$ is the contrast ratio, $\phi$ is the intrinsic phase caused by the length difference in the MZM arms, and $\phi_{RF}(x(t))$, $\phi_{RF}(V_{DC})$ are the phase shifts caused by the RF analog signal x(t) and the $V_{DC}$ bias voltage, respectively, which are given by $$\phi_{RF}(x(t)) = \frac{\pi}{V_{RF,\pi}} x(t),$$

$$\phi_{DC}(V_{DC}) = \frac{\pi}{V_{DC,\pi}} V_{DC},$$

where $V_{RF,\pi}$ is the half-wave voltage at RF and $V_{DC,\pi}$ is the half-wave voltage at DC.

Since it is desirable to obtain a highly linear response to the RF analog signal x(t) in case of ADC using conventional MZMs, the MZM parameters may be configured such that the electro-optical response of each of the conventional MZMs behaves as $$I(x(t)) = \frac{P_0}{2}\alpha(1 + \beta \sin(\phi_{RF}(x(t)))) = \frac{P_0}{2}\alpha\left(1 + \beta \sin\left(\frac{\pi}{V_{RF,\pi}} x(t)\right)\right).$$

Figure 9:
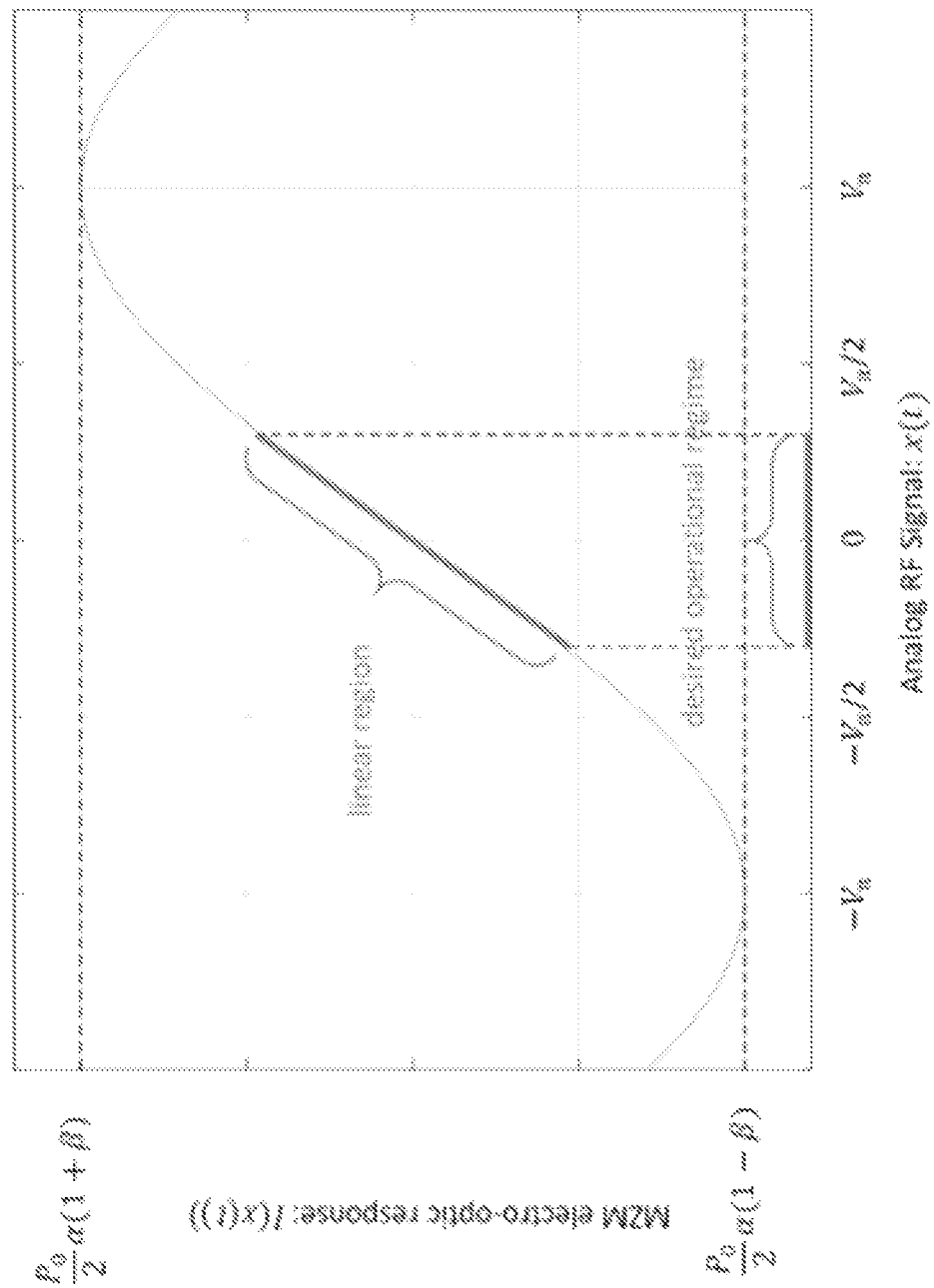
FIG. 9 shows an electro-optic response and a desired operational regime for a conventional MZM.

Thus, if the modulation index $$m_{RF} = \frac{\pi}{V_{RF,\pi}} \max|x(t)| \ll 1,$$

the linear region of a sine function is used, as shown in FIG. 9.

As opposed to the conventional MZM, the MZMs 812, 814 are configured such that they may operate in a regime where $$\|X(t)\| \gg V_{RF,\pi},$$

because, in the case of the modulo-based ADC, the RF analog signal x(t) should expand as many $2\pi$ periods of the MZM transfer function as desired, so that the signal x(t) is effectively folded in the step S402 of the method 400. In fact, in this case, the MZM modulation index, $$m_{RF} = \frac{\pi}{V_{RF,\pi}} \max|x(t)|,$$

directly determines the maximum number of folds supported by the modulo-based ADC implementation in accordance with the method 400. In consequence, as opposed to the conventional MZM, $m_{RF} \gg 1$, which allows one to fully use the sine/cosine transfer function of the MZM and not only its linear part.

To solve the problem of phase sign ambiguity arising, for example, from $\sin(x)=\sin(\pi-x)$, the MZMs 812, 814 should operate in parallel, for example, with the phase difference of $\pi/2$, namely:

$$I_A(x(t)) = \frac{P_0}{2}\alpha(1 + \beta \sin(\phi_{RF}(x(t)) + \phi)) = \frac{P_0}{2}\alpha\left(1 + \beta \sin\left(\frac{\pi}{V_{RF,\pi}} x(t) + \phi\right)\right),$$

$$I_B(x(t)) = \frac{P_0}{2}\alpha(1 + \beta \cos(\phi_{RF}(x(t)) + \phi)) = \frac{P_0}{2}\alpha\left(1 + \beta \cos\left(\frac{\pi}{V_{RF,\pi}} x(t) + \phi\right)\right).$$

Therefore, the ADC apparatus 800 comprises the two identical MZMs (A and B) 812, 814 with $V_{RF,\pi}=\lambda$ driven by the same optical source 810 and with the RF analog signal x(t) and the corresponding bias voltages $V_{DC,A}$ and $V_{DC,B}$ controlled such that the difference between the associated phases $\phi_{DC}(V_{DC,A})$ and $\phi_{DC}(V_{DC,B})$ is $\pi/2$.

The later steps S404 and S406 of the method 400 may be performed in the ADC apparatus 800 as follows. The digital representation y[$\ell$] may be obtained from the outputs of the two groups of ADC subunits:

$$\hat{y}_A[\ell] = Q_{b_A}(I_A(x(\ell T_s))),$$

$$\hat{y}_B[\ell] = Q_{b_B}(I_B(x(\ell T_s))),$$

as $$y[\ell] = \begin{cases} \frac{\lambda}{\pi}\arcsin\left(\left(\frac{2}{P_0\alpha}\right)\left(\frac{\hat{y}_A[\ell]-1}{\beta}\right)\right), & \hat{y}_B[\ell] > \frac{P_0}{2}\alpha \\ -\frac{\lambda}{\pi}\arcsin\left(\left(\frac{2}{P_0\alpha}\right)\left(\frac{\hat{y}_A[\ell]-1}{\beta}\right)\right), & \hat{y}_B[\ell] - \leq \frac{P_0}{2}\alpha \end{cases} \approx Q_b(\mathrm{mod}_2(x(\ell T_s))),$$

when the ADC subunits of the group called "Electronic ADC A" have a quantization function $Q_b(\cdot)$ with a resolution of $b_A=b$ bits and the ADC subunits of the group called "Electronic ADC B" are 1-bit ADC subunits, or as $$y[\ell] = \frac{\lambda}{\pi} \operatorname{atan}\left(\frac{\hat{y}_A[\ell]-1}{\hat{y}_B[\ell]-1}\right) \approx Q_b(\mathrm{mod}_\lambda(x(\ell T_s))),$$

when both the groups "Electronic ADC A" and "Electronic ADC B" have a quantization function $Q_b(\cdot)$ with a resolution of $b=b_A=b_B$ bits.

Figure 10:
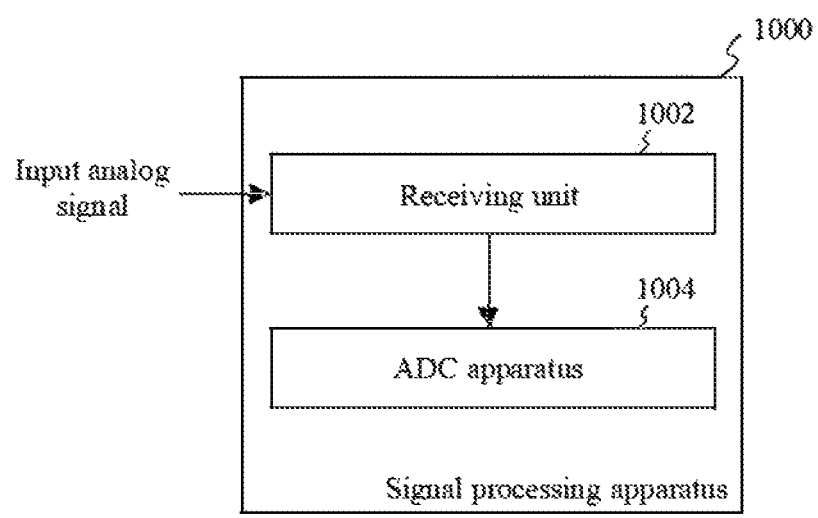
FIG. 10 shows a block diagram of a signal processing apparatus in accordance with one exemplary embodiment.

FIG. 10 shows a block diagram of a signal processing apparatus 1000 in accordance with one exemplary embodiment. The signal processing apparatus 1000 comprises a receiving unit 1002 and an ADC apparatus 1004. The receiving unit 1002 is configured to receive an input analog signal, for example, any of the above-discussed signals x(t), and provide the input analog signal to the ADC apparatus 1004 in order to obtain its digital representation, for example, any of the above-discussed digital representations y[$\ell$]. Given this, the ADC apparatus 1004 may be implemented as any one of the ADC apparatuses 300, 500, and 800, depending on particular applications. It should also be noted that the signal processing apparatus 1000 may be of a different type, depending on the analog input signal to be processed. For example, if the input analog signal is a wireless communication signal, the signal processing apparatus 1000 may be part of a communication apparatus, such as a UE or network node, in which the receiving unit 1002 may be implemented as a wireless receiver. In one other example, if the input analog signal is an AC voltage or current signal, the signal processing apparatus 1000 may be implemented as any measurement or sensing apparatus, such as a measurement bridge or network analyzer, in which the receiving unit 1002 may be implemented as a voltage or current sensor. In one other example, if the input analog signal is a sound signal, the signal processing apparatus 1000 may be implemented as a sound-pickup equipment, such as a microphone, in which the receiving unit 1002 may be implemented as a microphone capsule. In one other example, if the input analog signal is a radio wave, the signal processing apparatus 1000 may be implemented as a detector, such as a radar, in which the receiving unit 1002 may be implemented as a receiving antenna. Thus, the signal processing apparatus 1000 may be implemented as any apparatus which requires the modulo-based ADC for its operation.

It should be noted that each step or operation of the method 400, or any combinations of the steps or operations, can be implemented by various means, such as hardware, firmware, and/or software. As an example, one or more of the steps or operations described above can be embodied by processor executable instructions, data structures, program modules, and other suitable data representations. Furthermore, the executable instructions which embody the steps or operations described above can be stored on a corresponding data carrier and executed by at least one processor. This data carrier can be implemented as any computer-readable storage medium configured to be readable by said at least one processor to execute the processor executable instructions. Such computer-readable storage media can include both volatile and nonvolatile media, removable and non-removable media. By way of example, and not limitation, the computer-readable media comprise media implemented in any method or technology suitable for storing information. In more detail, the practical examples of the computer-readable media include, but are not limited to information-delivery media, RAM, ROM, EEPROM, flash memory or other memory technology, CD-ROM, digital versatile discs (DVD), holographic media or other optical disc storage, magnetic tape, magnetic cassettes, magnetic disk storage, and other magnetic storage devices.

Although the exemplary embodiments of the present disclosure are described herein, it should be noted that any various changes and modifications could be made in the embodiments of the present disclosure, without departing from the scope of legal protection which is defined by the appended claims. In the appended claims, the word "comprising" does not exclude other elements or operations, and the indefinite article "a" or "an" does not exclude a plurality. The mere fact that certain measures are recited in mutually different dependent claims does not indicate that a combination of these measures cannot be advantageously used.

What is claimed is:

1. An analog-to-digital conversion apparatus comprising:
   a signal-to-phase converter configured to convert an input analog signal into phases of M periodic reference signals based on at least one transfer functions, wherein M≥2, and wherein the phase of each of the M periodic reference signals comprises the input analog signal amplitude-folded into a folded signal that falls within an amplitude range;
   an analog-to-digital converter (ADC) configured to obtain M discrete-time digital signals by performing an ADC operation on the M periodic reference signals within the amplitude range; and
   a digital signal processor (DSP) configured to obtain, based on the M discrete-time digital signals, a digital representation of the input analog signal.

2. The analog-to-digital conversion apparatus of claim 1, wherein the phases of at least two of the M periodic reference signals have a difference other than 0 or π.

3. The analog-to-digital conversion apparatus of claim 1, wherein the input analog signal changes in a predefined dynamic range, and wherein each of the at least one transfer functions is a bijective function in the predefined dynamic range of the input analog signal.

4. The analog-to-digital conversion apparatus of claim 3, wherein the at least one transfer functions comprises a first transfer function and a second transfer function, wherein, in the predefined dynamic range of the input analog signal, the first transfer function and the second transfer function are a same bijective function, wherein the first transfer function has a first constant phase shift and the second transfer function has a second constant phase shift, and wherein the first constant phase shift of the first transfer function and the second constant phase shift of the second transfer function have a difference other than 0 or π.

5. The analog-to-digital conversion apparatus of claim 1, wherein each of the at least one transfer functions is an affine function.

6. The analog-to-digital conversion apparatus of claim 1, wherein the ADC comprises M synchronized ADC subunits each configured to perform the ADC operation on one of the M periodic reference signals.

7. The analog-to-digital conversion apparatus of claim 6, wherein at least one of the M synchronized ADC subunits has a different bit resolution or a different quantization level compared to the other synchronized ADC subunits of the M synchronized ADC subunits.

8. The analog-to-digital conversion apparatus of claim 1, wherein the DSP is configured to obtain the digital representation of the input analog signal by:
   determining a phase of at least one of the M discrete-time digital signals;
   inverting one of the at least one transfer functions based on the determined phase, while using at least one other of the M discrete-time digital signals to solve phase sign ambiguity; and
   obtaining the digital representation of the input analog signal based on the inverted transfer function.

9. The analog-to-digital conversion apparatus of claim 1, wherein the signal-to-phase converter comprises:
   an optical source configured to generate a pulse train configured to serve as the M periodic reference signals; and
   M phase-biased electro-optic modulators each having an electro-optical response as one of the at least one transfer functions and configured to receive the input analog signal and modulate the pulse train with the input analog signal, thereby converting the input analog signal into the phases of the M periodic reference signals.

10. The analog-to-digital conversion apparatus of claim 9, wherein the optical source comprises a mode-locked laser.

11. The analog-to-digital conversion apparatus of claim 9, wherein each of the M phase-biased electro-optic modulators comprises a Mach-Zehnder modulator.

12. The analog-to-digital conversion apparatus of claim 11, wherein at least two of the M Mach-Zehnder modulators have a modulation index that is more than 1.

13. The analog-to-digital conversion apparatus of claim 12, wherein the at least two Mach-Zehnder modulators have a same bijective transfer function supplemented by different constant phase shifts which are obtained by applying different DC bias voltages to the at least two Mach-Zehnder modulators.

14. The analog-to-digital conversion apparatus of claim 1, wherein the DSP is configured to obtain the digital representation of the input analog signal by applying a machine-learning algorithm.

15. An analog-to-digital conversion method comprising:
   converting an input analog signal into phases of M periodic reference signals based on at least one transfer function, wherein M≥2, and wherein the phase of each of the M periodic reference signals comprises the input analog signal amplitude-folded into a folded signal that falls within an amplitude range;

obtaining M discrete-time digital signals by performing an ADC operation on the M periodic reference signals within the amplitude range; and based on the M discrete-time digital signals, obtaining a digital representation of the input analog signal.

16. The method of claim 15, wherein the phases of at least two of the M periodic reference signals have a difference other than 0 or $\pi$.

17. The method of claim 15, wherein the input analog signal changes in a predefined dynamic range, and wherein each of the at least one transfer functions is a bijective function in the predefined dynamic range of the input analog signal.

18. The method of claim 17, wherein the at least one transfer functions comprise a first transfer function and a second transfer function, and wherein, in the predefined dynamic range of the input analog signal, the first transfer function and the second transfer function are a same bijective function, wherein the first transfer function has a first constant phase shift and the second transfer function has a second constant phase shift, and wherein the first constant phase shift of the first transfer function and the second constant phase shift of the second transfer function have a difference other than 0 or $\pi$.

19. The method of claim 15, wherein each of the at least one transfer functions is an affine function.

20. A computer program product comprising:

a non-transitory computer-readable storage medium storing a computer code which, when executed by at least one processor, causes the at least one processor to perform: converting an input analog signal into phases of M periodic reference signals based on at least one transfer function, wherein M≥2, and wherein the phase of each of the M periodic reference signals comprises the input analog signal amplitude-folded into a folded signal that falls within an amplitude range;

obtaining M discrete-time digital signals by performing an ADC operation on the M periodic reference signals within the amplitude range; and based on the M discrete-time digital signals, obtaining a digital representation of the input analog signal.

* * * * *